United States Patent
Upadhyaya et al.

(10) Patent No.: US 10,217,703 B2
(45) Date of Patent: Feb. 26, 2019

(54) CIRCUITS FOR AND METHODS OF IMPLEMENTING AN INDUCTOR AND A PATTERN GROUND SHIELD IN AN INTEGRATED CIRCUIT

(71) Applicant: Xilinx, Inc., San Jose, CA (US)

(72) Inventors: Parag Upadhyaya, Los Gatos, CA (US); Jing Jing, San Jose, CA (US)

(73) Assignee: XILINX, INC., San Jose, CA (US)

( * ) Notice: Subject to any disclaimer, the term of this patent is extended or adjusted under 35 U.S.C. 154(b) by 27 days.

(21) Appl. No.: 15/397,612

(22) Filed: Jan. 3, 2017

(65) Prior Publication Data

US 2018/0190584 A1 Jul. 5, 2018

(51) Int. Cl.
| | | |
|---|---|---|
| *H01L 23/522* | (2006.01) | |
| *H01L 49/02* | (2006.01) | |
| *H01L 21/768* | (2006.01) | |
| *H03B 5/12* | (2006.01) | |
| *H01L 23/64* | (2006.01) | |
| *H01L 29/40* | (2006.01) | |

(52) U.S. Cl.
CPC .... *H01L 23/5225* (2013.01); *H01L 21/76877* (2013.01); *H01L 23/5226* (2013.01); *H01L 23/5227* (2013.01); *H01L 23/645* (2013.01); *H01L 28/10* (2013.01); *H01L 29/402* (2013.01); *H03B 5/1215* (2013.01); *H03B 2201/0208* (2013.01)

(58) Field of Classification Search
CPC ............... H01L 21/768; H01L 23/5225; H01L 23/5226; H01L 23/5227; H01L 23/5286; H01L 23/645; H01L 24/05; H01L 27/0288; H01L 28/10; H01L 29/402; H01L 29/407; H01L 2224/05009; H01L 2924/1206
See application file for complete search history.

(56) References Cited

U.S. PATENT DOCUMENTS

| | | | |
|---|---|---|---|
| 7,323,948 B2 * | 1/2008 | Ding | ............ H01L 23/5223 257/531 |
| 8,686,539 B1 | 4/2014 | Kireev et al. | |
| 8,717,115 B2 | 5/2014 | Upadhyaya | |
| 8,841,948 B1 | 9/2014 | Chien et al. | |
| 8,860,180 B2 | 10/2014 | Jing et al. | |
| 8,941,972 B2 | 1/2015 | Park et al. | |
| 9,148,192 B1 | 9/2015 | Wong et al. | |
| 9,325,277 B1 | 4/2016 | Bekele et al. | |
| 9,356,556 B1 | 5/2016 | Raj et al. | |
| 2009/0250262 A1 | 10/2009 | Jin | |
| 2012/0242446 A1* | 9/2012 | Wu | ............ H01F 17/0006 336/192 |

FOREIGN PATENT DOCUMENTS

WO 2012128832 9/2012

* cited by examiner

*Primary Examiner* — Stephen W Smoot
(74) *Attorney, Agent, or Firm* — Kevin T. Cuenot

(57) ABSTRACT

An integrated circuit device is described. The integrated circuit device comprises a substrate; a plurality of metal routing interconnect layers; an inductor formed in at least one metal layer of the plurality of metal routing interconnect layers; and a bottom metal layer between the plurality of metal routing interconnect layers and the substrate; wherein a pattern ground shield is formed in the bottom metal layer. A method of implementing an integrated circuit device is also disclosed.

20 Claims, 11 Drawing Sheets

1302  
1304

US 10,217,703 B2

CIRCUITS FOR AND METHODS OF IMPLEMENTING AN INDUCTOR AND A PATTERN GROUND SHIELD IN AN INTEGRATED CIRCUIT

TECHNICAL FIELD

The present invention relates generally to integrated circuit devices, and in particular, to circuits for and methods of implementing an inductor and a pattern ground shield in an integrated circuit.

BACKGROUND

Inductors are important elements of many electronic devices. Inductors may also be implemented in integrated circuits, such as within an oscillator of an integrated circuit. However, as the density of integrated circuits continue to increase, noise may affect certain circuits of the integrated circuit. An inductor may be one element of an integrated circuit that may be affected by noise, and require shielding to improve the quality factor, or Q-factor, of the integrated circuit.

In general, a pattern ground shield (PGS) metal associated with a spiral inductor enables shielding and picking up the substrate noise, as well as enhancing Q-factor of a spiral inductor. Theoretically, if the PGS can be transparent to spiral inductor's H-field and block the spiral inductor's E-field from penetrating into the electrically lossy substrate without introducing any conduction current, then the Q-factor of a spiral inductor can be improved. As the integrated circuit industry moves to 7 nanometer (nm) transistor channel length dimensions and below, unidirectional metal and metal mask coloring may be required, making the implementation of a PGS in an integrated circuit device complex.

Accordingly, circuits and methods of implementing an inductor in an integrated circuit are desired.

SUMMARY

An integrated circuit device is described. The integrated circuit device comprises a substrate; a plurality of metal routing interconnect layers; an inductor formed in at least one metal layer of the plurality of metal routing interconnect layers; and a bottom metal layer between the plurality of metal routing interconnect layers and the substrate; wherein a pattern ground shield is formed in the bottom metal layer.

Another integrated circuit device comprises a substrate; a plurality of metal routing interconnect layers; an inductor formed in at least one metal layer of the plurality of metal routing interconnect layers; and an isolation wall extending above a pattern ground shield and surround the inductor; wherein the pattern ground shield is formed in a bottom layer of the plurality of metal routing interconnect layers, and the bottom layer is a unidirectional metal layer and is connected to the isolation wall using a trace of a layer of the plurality of metal routing interconnect layers above the bottom layer.

A method of implementing an integrated circuit device is also described. The method comprises providing a plurality of metal routing interconnect layers; forming an inductor in at least one metal layer of the plurality of metal routing interconnect layers; and forming a pattern ground shield in a bottom metal layer between the plurality of metal routing interconnect layers and a substrate.

Other features will be recognized from consideration of the Detailed Description and the Claims, which follow.

DETAILED DESCRIPTION

Figure 1:
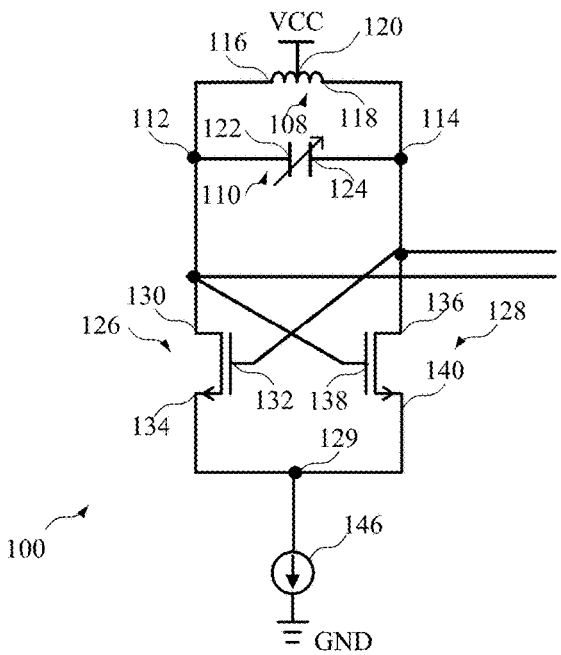
FIG. 1 is a block diagram of a circuit for implementing an oscillator using an inductor.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

The implementation of a PGS is desirable for LC tanks in both wired and wireless communications. The systems and methods set forth below describe a PGS using a MEOL (Middle end of line) layer which allows for higher self-resonance frequency (SRF). The circuits and methods enable high speed communication, and can work with unidirectional metallization of a scaled process. That is, the transistor scaling to 7 nm gate widths also results in the scaling of interconnect metals such as metal layers M0-M4 as described below. Due to lithography limitations, self-aligned double patterning (SADP) or even self-aligned quadruple patterning (SAQP) may be required to realize a required scaled metal pitch. Due to patterning challenges, designs may be subjected to forbidden pitches or to a preferred orientation or unidirectional designs with a very limited set of pitches. In devices having 7 nm transistors implemented with SADP, unidirectional metals may be required during manufacturing, which complicates the design of PGS for inductors. The circuits and methods can meet the requirement of 7 nm and sub-7 nm transistor technology, which utilize unidirectional Mx metal layers.

The implementation of metal traces associated with 7 nm transistor technology and are unidirectional metal makes design of a pattern ground shield used to improve a spiral inductor's Q-factor challenging. The circuits and methods improve a spiral inductor's Q-factor using unidirectional metals and mask coloring to realize a PGS. The PGS may utilize P+ diffusion at the edge of the PGS connected up higher level conductive metal layers. An M0 layer, which is lower than the M1 layer traditionally used in a Hi-K process, is utilized to insure low parasitic capacitance for the inductor to achieve a higher self-resonance frequency (SRF) and high Q-factor spiral inductor. The PGS structure not only maintains the functionality of noise pickup at the isolation wall and electrical noise shielding, it also reduces the penetration of spiral inductor's E-field into the electrically lossy substrate and prevents the conduction current from flowing on PGS metal, which also helps improve the Q-factor of a spiral inductor. The PGS for the spiral inductor utilizes grounded M0 stubs under the spiral inductor tied to a P+ diffusion and an isolation wall used as predefined current return path using M1 and higher level metals.

Turning first to FIG. 1, a block diagram of a circuit for implementing an oscillator 100 using an inductor is shown. The oscillator comprises a first inductor 108 coupled in parallel with a first capacitor 110 between a first node 112 and a second node 114. The first capacitor 110 is a variable capacitor, such as a voltage controlled capacitor, which enables programmable control of the capacitor to select a capacitance associated with the capacitor. A first node 116 of the inductor 108 is coupled to the node 112 and a second node 118 of the inductor is coupled to the node 114, while a center tap 120 of the inductor is coupled to a reference voltage, shown here by way of example as VCC. A first node 122 of the capacitor is coupled to the node 112, while a second node 124 of the capacitor is coupled to the node 114. As will be described in more detail below, an oscillating signal generated across the first node 112 and the second node 114 can be generated as an output.

A first pair of cross-coupled transistors including a first transistor 126 and a second transistor 128 are also coupled between the first and second nodes 112 and 114 and a node 129. In particular, a drain 130 of the first transistor 126 is coupled to the node 112, while a gate 132 is coupled to the node 114. A source 134 of the first transistor is coupled to the node 129. A drain 136 of the second transistor is coupled to the node 114, and a gate 138 is coupled to the node 112. A source 140 is coupled to the node 129. A current source 146 is also coupled to the node 129. While the circuit of FIG. 1 is shown by of example, it should be understood that other circuits could be used to implement an oscillator, and that the inductor described in more detail below could be implemented in circuits other than an oscillator. It should be noted that transistors 126 and 128, as well as other transistors of an integrated circuit device having the oscillator 100 could be formed with transistors having gate widths that are less than 10 nanometers (nm), such as gate widths of 7 nm for example.

Figure 2:
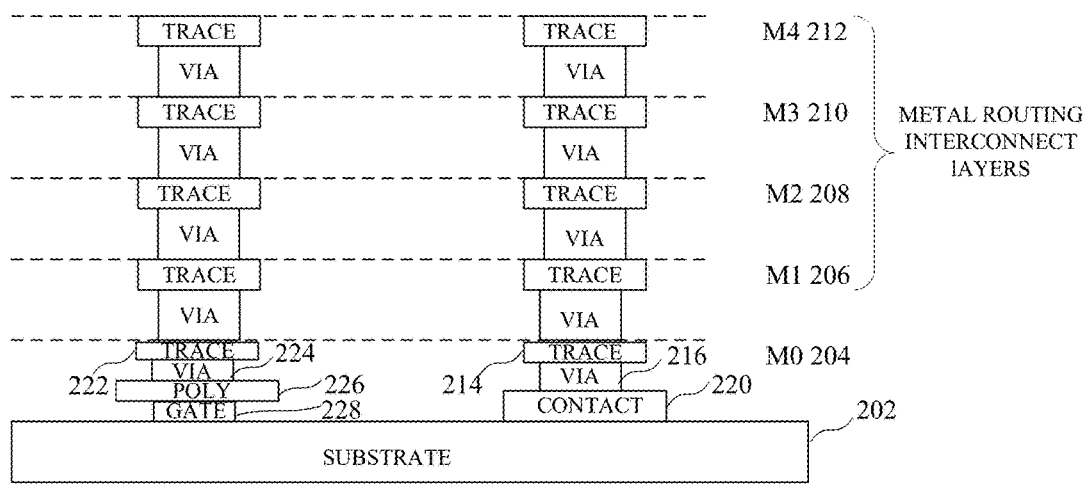
FIG. 2 is a cross-sectional view of metal layers of an integrated circuit device showing a bottom metal layer between metal interconnect routing layers and a substrate.

Turning now to FIG. 2, a cross-sectional view of metal layers of an integrated circuit device showing a bottom metal layer between metal interconnect routing layers and a silicon substrate is shown. More particularly, a substrate 202, which may be a silicon substrate for example, is provided and receives various middle end of line (MEOL) and back end of line (BEOL) metal layers. A first metal layer, designated as metal layer M0 204 (considered an MEOL layer) layer is provided below a plurality of metal routing interconnect layers, shown here as metal layer M1 206, metal layer M2 208, metal layer M3 210, and metal layer M4 212. The metal layers M1-M4, which are BEOL Layers, comprise metal routing interconnect layers, and provide traces for routing signals within the integrated circuit device, and enable routing within the integrated circuit device at any distance using short or long traces. In contrast, the metal layer M0 includes a trace 214 enabling a connection vertically to the substrate, such as by way of a via 216 and a contact element 220. However, traces in the M0 layer are generally high resistance traces and are generally not suitable for providing a routing path that covers a long distance. The metal layer M0 may be made of a different material or may be thinner than the metal routing interconnect layers M1-M4, leading to the greater resistance. The contact 220, which may be a P+ diffusion contact for example, may also be provided to the silicon substrate below the trace 214 of the M0 layer and a via 216 and coupled to the silicon substrate.

The M0 layer may also enable elements of transistors. For example, a trace 222 of metal layer M0 may be coupled by a via 224 to a polysilicon layer 226 and a gate 228. As will be described in more detail below, a PGS is provided in the metal layer M0. While the four metal layers above the bottom metal layer are shown by way of example, it should be understood that many more metal layers may be implemented, such as 17 metal layers in many integrated circuit devices. It should also be noted that the traces of the metal routing interconnect layers may have different dimensions, where the lower metal layers such as metal layers M1-M4 may have smaller dimension, and therefore be implemented as unidirectional metal layers. Unidirectional metal layers may have limitations related to the patterns that can be implemented. For example, because a trace in a unidirectional metal layer can only extend in one direction, it may not be possible to form a trace having a 90 degree angle in a unidirectional metal layer, which would prevent the formation or "L" or "T" shapes. Metal layers that enable traces to have 90 degree angles could be considered bi-directional metal layers. By way of example, the M0 trace widths and pitch (i.e. spacing between the traces) may be similar to the trace widths and pitch for the M2 and M3 layers. The M1 trace widths may be wider and its pitch may be little larger than for metal layers M2 and M3. The M4 trace widths and its pitch may be even wider than for the M1 traces. A minimum width and pitch for traces of M0, M2 and M3 may be approximately 20 nm, while M1 traces may have a trace width of 34 nm and a pitch of approximately 23 nm. M4 traces may have a width of approximately 38 nm and a pitch of approximately 38 nm.

Figure 3:
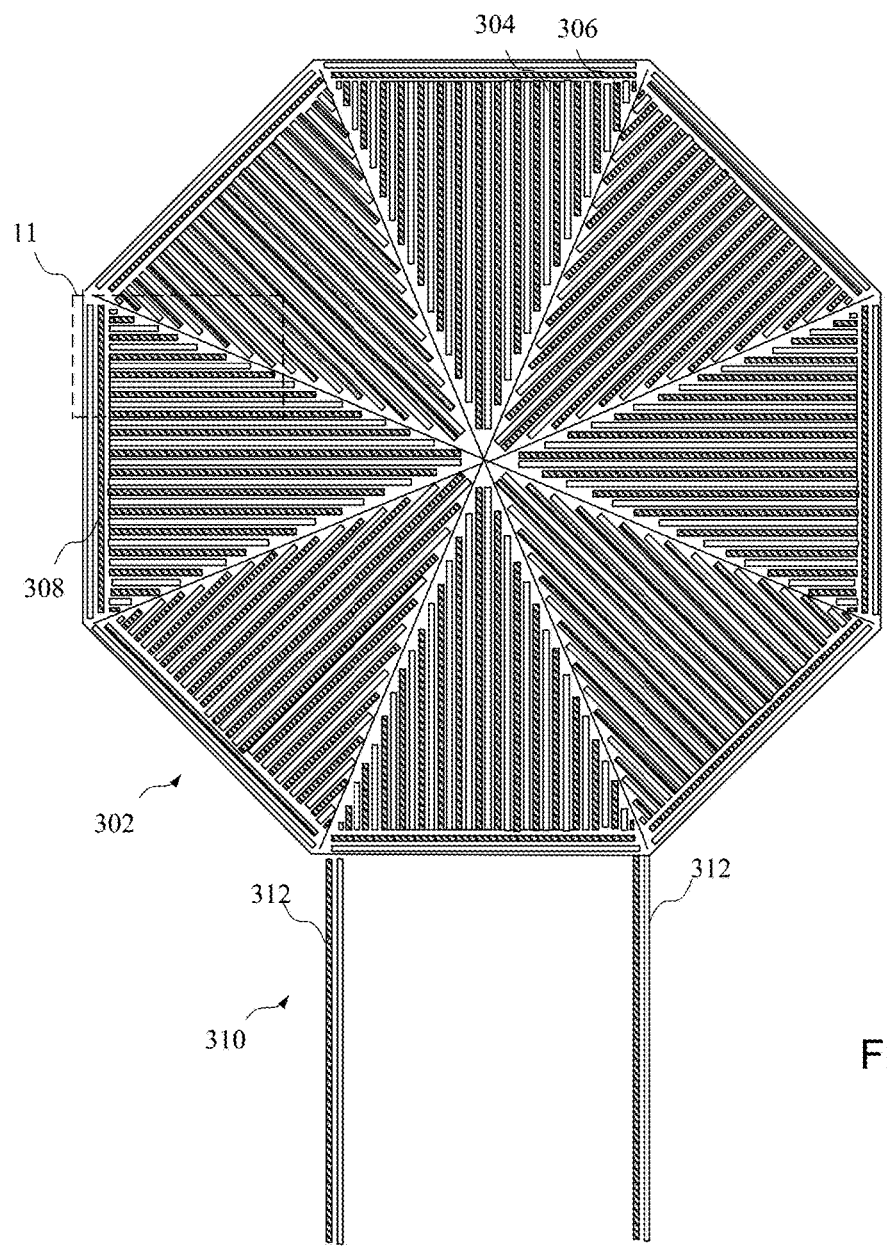
FIG. 3 is a top plan view of a pattern ground shield and isolation walls.

Turning now to FIG. 3, a top plan view of a pattern ground shield 302 is shown. In particular, the pattern ground shield 302 is shown here shaped as an octagon to match the shape of the coil portion of the inductor. The pattern ground shield is formed using separate mask layers, shown here forming separate traces 304 and 306. The implementation of the metal traces formed by the different masks will be described in more detail in reference to FIGS. 11-13, which shows an enlarged portion of the pattern ground shield designated by the dashed box 11. An isolation wall 308 extends up from the ground pattern shield 302, as will be shown and described in more detail below in FIG. 7-10, which show the traces of the isolation wall 308. A second portion 310 of the isolation wall comprises an isolation wall 312 on each side and adjacent to the transformer legs, which will be shown and described in reference to FIGS. 4-6.

Figure 4:
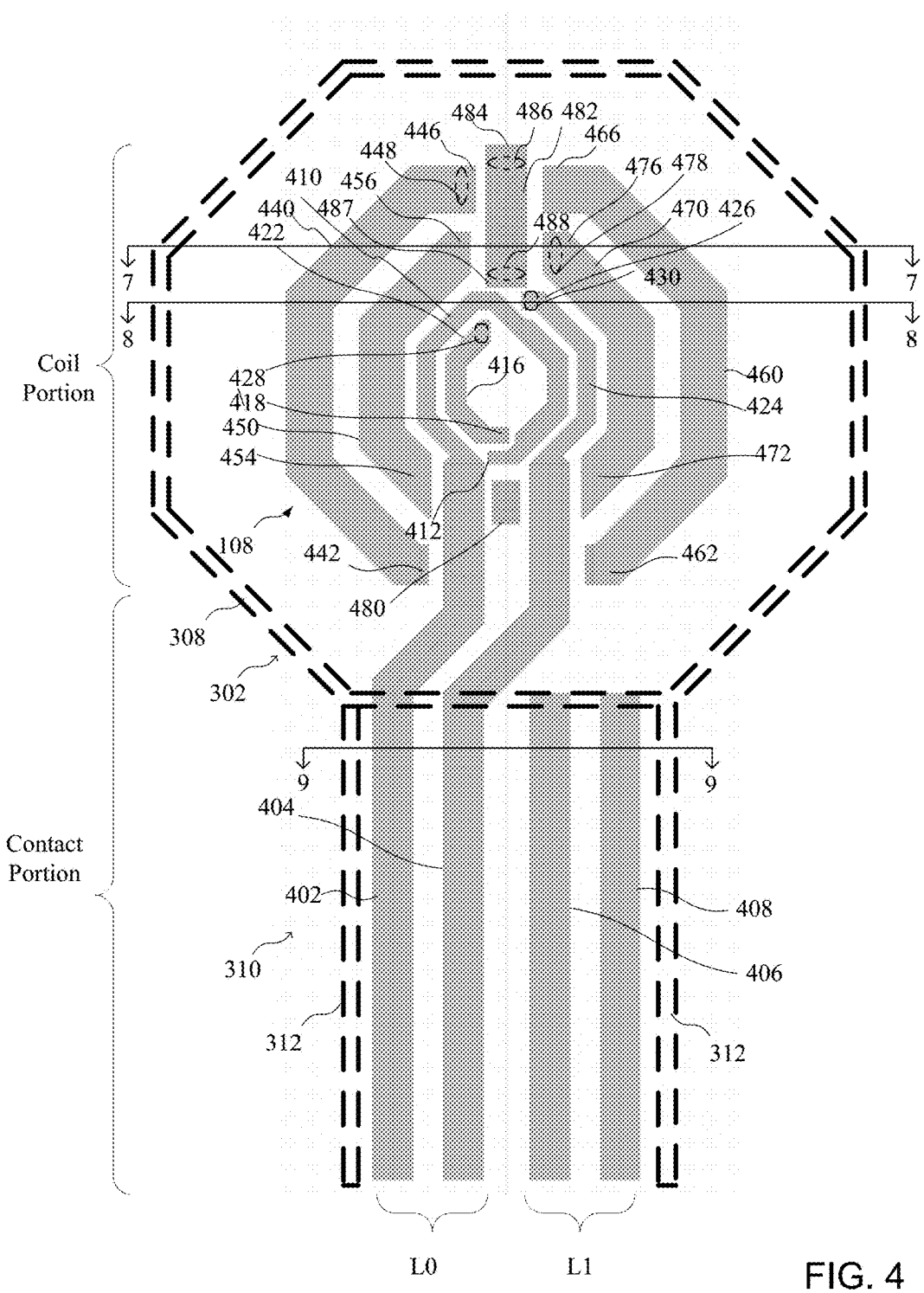
FIG. 4 is a plan view showing a first metal layer of an inductor implemented above the bottom metal layer.
Figure 5:
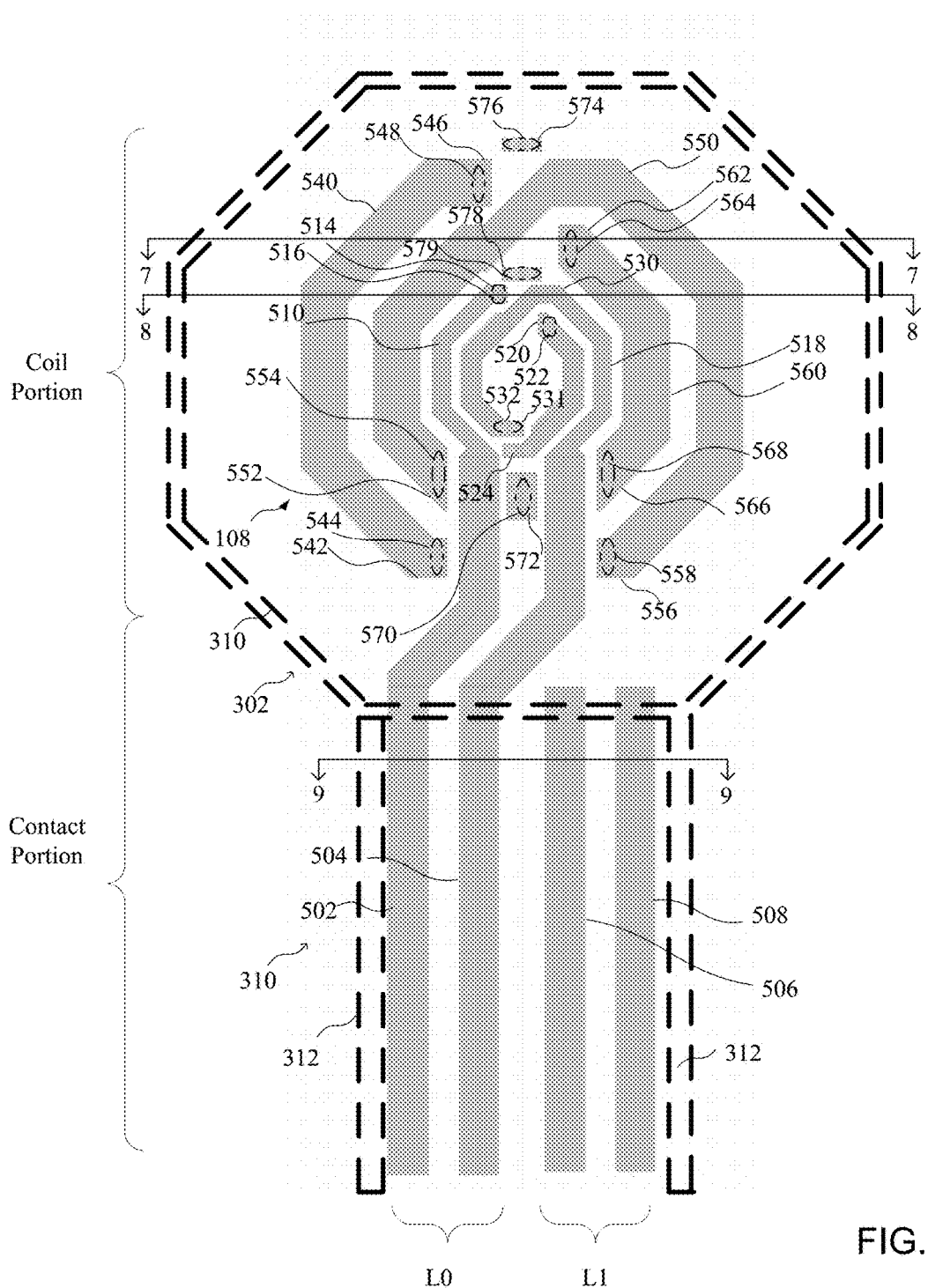
FIG. 5 is a plan view showing a second metal layer of an inductor implemented in above the bottom metal layer.
Figure 6:
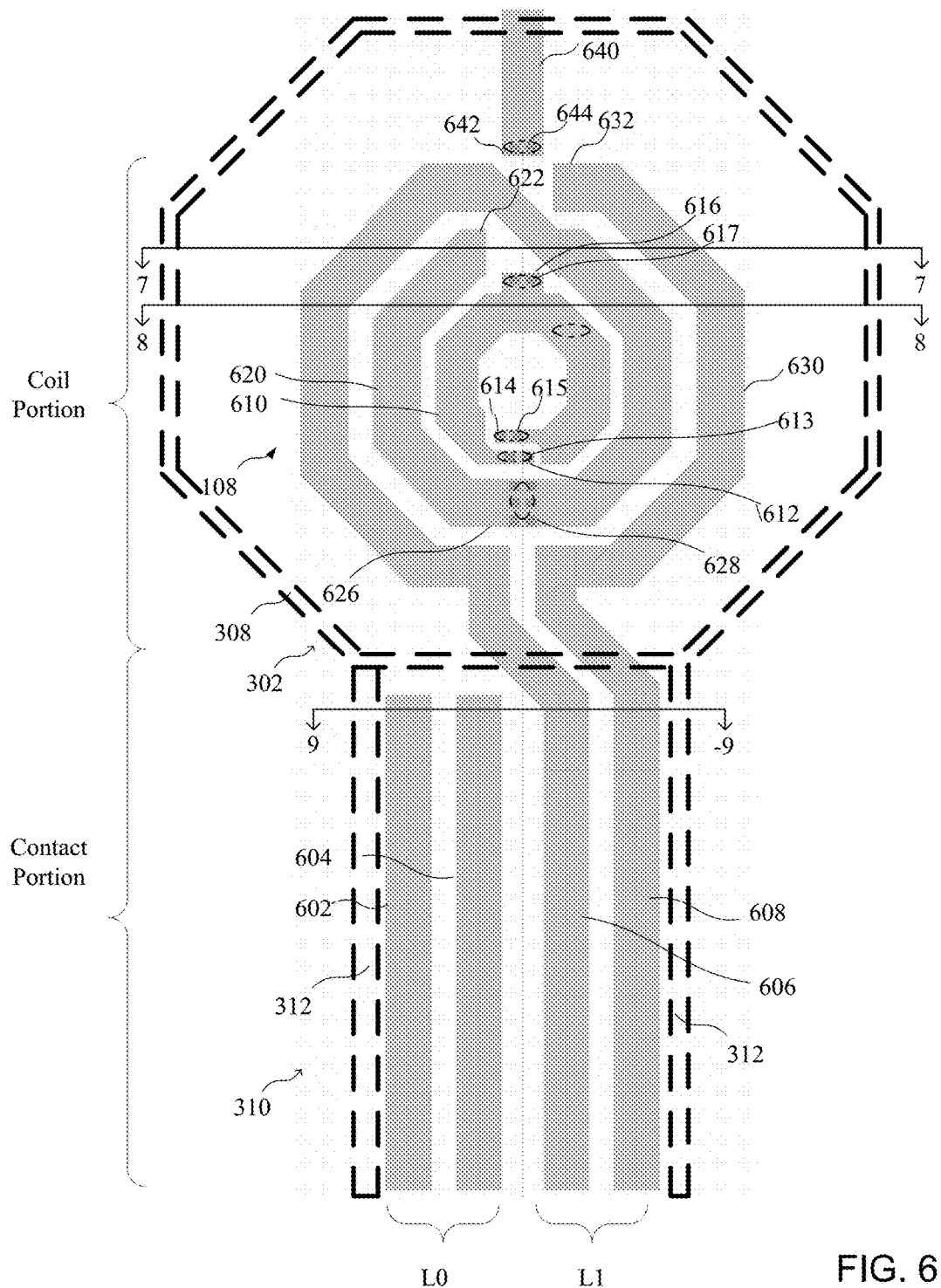
FIG. 6 is a plan view showing a third metal layer of an inductor implemented in above the bottom metal layer.

Turning now to FIGS. 4-6, plan views of different metal layers having an inductor enabling the implementation of a dual-mode oscillator. The transformer consists an outer inductor L1 and inner inductor L0. Inner inductor L0 is placed inside the outer inductor to reduce area. The inductor L0 consists of multiple layers of metals in series such that it has same inductance as L1 even with its smaller size. Unlike conventional transformer legs that extend in opposite directions, making the size large, or for legs on the same side which are generally not symmetric, the legs of L1 and L0 terminate on the same side and are symmetrically designed to extend to the right and left, respectively, of the center of the oscillator to make the layout more amenable to conventional LC VCO design.

In particular, transformer legs 402 and 404 associated with the inductor L0 and transformer legs 406 and 408 associated with inductor L1 of a contact portion, as shown in FIG. 4, are coupled to a coil portion. Transformer leg 402 comprises a first terminal of the inductor L0 and transformer leg 404 comprises a second terminal of the inductor L0. Similarly, transformer leg 406 comprises a first terminal of the inductor L1 and transformer leg 408 comprises a second terminal of the inductor L1. As will be described in more detail below, the transformer legs comprise traces in metal layers of an integrated circuit, and are coupled together in multiple metal layers by vias which extend between adjacent metal layers. Therefore, the transformer legs form continuous structures through the three metal layers. Transformer leg 402 extends to a first coil portion 410, leading to an end 412. A second coil portion 416 is inside the first coil portion 410, and extends from a first end 418 to a second end 422. A portion 424 of the first coil extends from an end 426 to the transformer leg 404.

As with the transformer legs, overlapping portions of the coils in different metal layers are connected by vias along the length of the portion of the coil to provide larger coils to increase inductance. As will further be described in more detail below, openings are provided to enable connections between different portions of coils to create the coil structures of FIGS. 4-6. Locations of via portions are shown in dashed lines to indicate where "crossovers" in other metal layers enable creating the openings. For example, vias above the bottom metal of FIG. 4 enable connections to traces of the metal layer of FIG. 5, where a portion of the vias corresponding to regions 428 and 430 enable passing over the coil portion 410. The openings and crossovers will be described in more detail in reference to FIGS. 7-9.

The outer coil portion also comprises a number of coil portions, where regions of vias above the coil portions enable passing over other elements of the inductors. In particular, a coil portion 440 associated with an outer ring of the inductor L1 extends from an end 442 to an end 446, where a region 448 is coupled to a crossover element of FIG. 5 to enable crossing over another element of the inductors in FIG. 4. A coil portion 450 associated with the outer coil of the inductor L1 extends from an end 454 to an end 456. A coil portion 460 also associated with the outer ring extends from a first end 462 to a second end 466, while a coil portion 470 extends from an end 472 to an end 476, where vias in a region 478 are used to enable crossing over an element of the metal layer of FIG. 4.

A tap portion 480 is coupled to a center tap of the inductor L1, while a tap portion 482 is coupled to a center tap of the inductor L0. The tap portion 482 extends from a first end 484 (having a region 486 where vias are used to enable crossing under an element of the metal layer of FIG. 5) to a second end 487 (having a region 488 where vias are used to enable crossing under the element of the metal layer of FIG. 5). That is, vias above the metal layer of FIG. 4 in regions 448 and 474 enable crossover elements in the metal layer of FIG. 5 to cross over tap portion 482.

The middle layer of the inductor shown in FIG. 5 also include elements of both inductors L0 and L1. In particular, transformer leg 502 extends to a first coil portion 510, leading to an end 514 having a region 516 where vias in a via layer above the metal layer of FIG. 5 are used to enable crossing over another element. A second coil portion 518 is inside the first coil portion 510, and extends from a first end 520 (having a region 522 where vias in a via layer above the metal layer of FIG. 5 are used to enable crossing over another element) to a second end 524. A coil portion 530 of the inductor L0 extends from an end 531 to the transformer leg 504. Transformer legs 506 and 508 are also provided. A region 532 includes vias to enable crossing over elements of FIG. 5.

The outer coil portion also comprises a number of coil portions, including a coil portion 540 associated with an outer ring of the inductor L1 extends from an end 542 (having a region 544 coupled to a crossover element to enable crossing over another element of the inductors in FIG. 5) to an end 546 (having a region 548 coupled to a crossover element to enable crossing over another element of the inductors in FIG. 5). A coil portion 550 associated with the outer coil of the inductor L1 extends from an end 552 (having a region 554 coupled to a crossover element to enable crossing over another element of the inductors in FIG. 5) to an end 556 (having a region 558 coupled to a crossover element to enable crossing over another element of the inductors in FIG. 5). A coil portion 560 also associated with the outer ring extends from a first end 562 (having a region 564 coupled to a crossover element to enable crossing over another element of the inductors in FIG. 5) to a second end 566 (having a region 568 coupled to a crossover element to enable crossing over another element of the inductors in FIG. 5). The tap portion 570 having a region 572 is associated with a tap L1, while a tap portion 574 (having a region 576 of vias enabling a crossover portion of FIG. 6) and a tap portion 578 (having a region 579 of vias enabling a crossover portion of FIG. 6) is associated with the tap for inductor L0.

Finally, the top layer is shown in FIG. 6, the transformer legs 602 and 604 associated with the inductor L0 and transformer legs 606 and 608 are coupled by vias to corresponding transformer legs 502 and 504 of layer 5 and corresponding transformer legs 402 and 404 of layer 4. The center coil portion 610 associated with the inner coil L0 extend from a first end 612 (having a region 613 corresponding to region 524) to a second end 614 (having a region 615 below which vias are used to couple to portions of the inner coil L0). A center tap region 616 (having a region 617 below which vias 579 are used to couple to the tap portion 578 for the inner coil L0) is shown in the center of the center coil portion 610. The outer coil L1 includes a portion 620 extending from an end 622 through a center tap region 626 (having a region 628 below which vias are used to couple to the tap 570 for the outer coil L1) to the transformer leg 606. The outer coil L1 also includes a portion 630 extending from an end 632 to the transformer leg 608. A tap element 640 of FIG. 6 is coupled to other tap for the inner coil L0 where vias at the end 642 below region 644 are coupled to other tap elements for inner coil L0. While each of the inductors L0 and L1 are shown having multiple turns, it should be understood that they could have a single turn. Further, while the coils of the inductors are shown having an octagonal shape, they could have other shapes, such as square, hexagonal, circular, etc.

Figure 7:
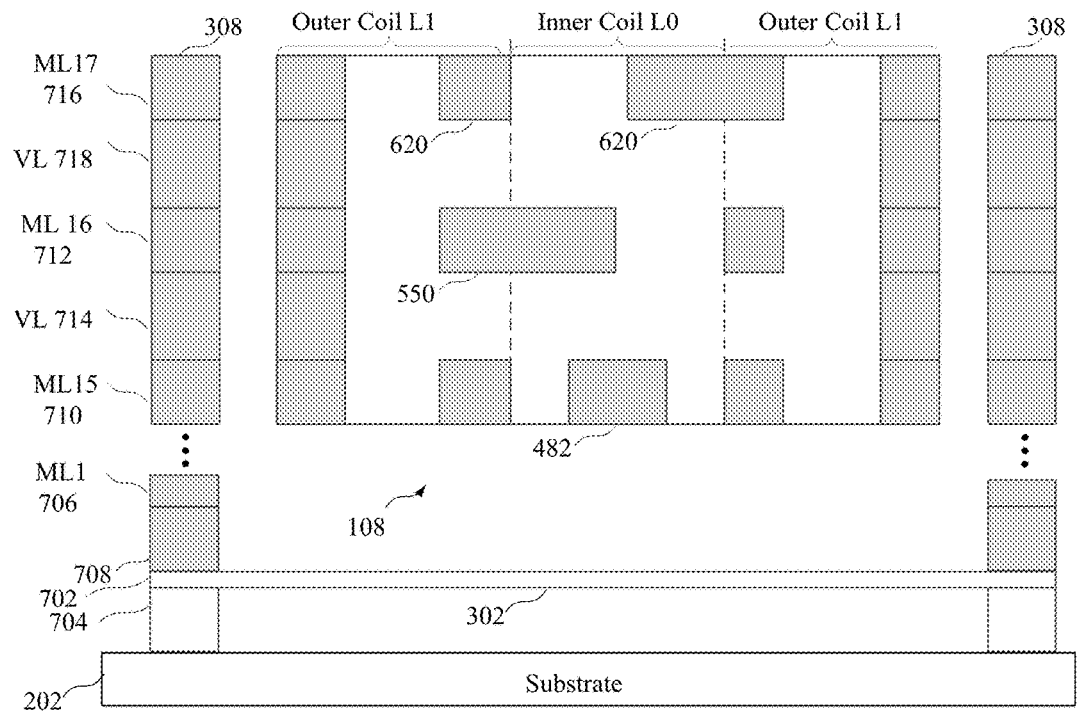
FIG. 7 is a first cross-sectional view showing the metal layers taken at lines 7-7.

Turning now to FIGS. 7-10, cross-sectional views show the arrangement of the isolation wall 308 and how elements at certain locations in the different metal layers are not connected to vias, and therefore pass through recesses above and below metal elements in the metal layers below and above the elements, respectively. A substrate 202 is coupled to the pattern ground shield 302 of the metal layer M0 by a contact element 704 which may be a diffusion contact element for example. The wall 308 extends upward from the pattern ground shield 302, implemented in the metal layer 702, which is the M0 metal layer, using alternating vias and metal layers, including metal layer M1 706 coupled to a via 708 and other metal layers between the metal layers used to form the inductor 108. By way of example, 17 metal layers are used in the integrated circuit device of FIG. 7, where the metal layers M15 through M17 are used to from the inductor 108 and the wall 308. As shown in FIG. 7, the wall 308 is formed using metal layer 710 coupled to metal layer 712 by a via of the via layer 714. Metal layer 716 is also coupled to metal layer 712 by a via of the vial layer 718.

The cross-sectional view of FIG. 7 taken at lines 7-7 also shows how elements in the three metal layers (including metal layers 710, 712, and 716, corresponding to the consecutive metal layers in FIGS. 4-6) are not connected to vias above or below the elements, and therefore pass through an opening. For example, vias are not coupled to a portion of the metal layer 710 to enable passing over the tap portion 482. Further, in the next metal layer 712, portions of the coil portion 530 and 550 are not connected to vias to create a recess through which the coil portion can pass. For example, a portion of coil portion 550 is not connected to vias, and is therefore able to pass under a portion of the coil portion 620. Finally, a portion of the coil portion 620 passes under traces in a metal layer above the metal layer 716 of FIG. 6 connecting the center tap region 616 to the tap element 640.

Figure 8:
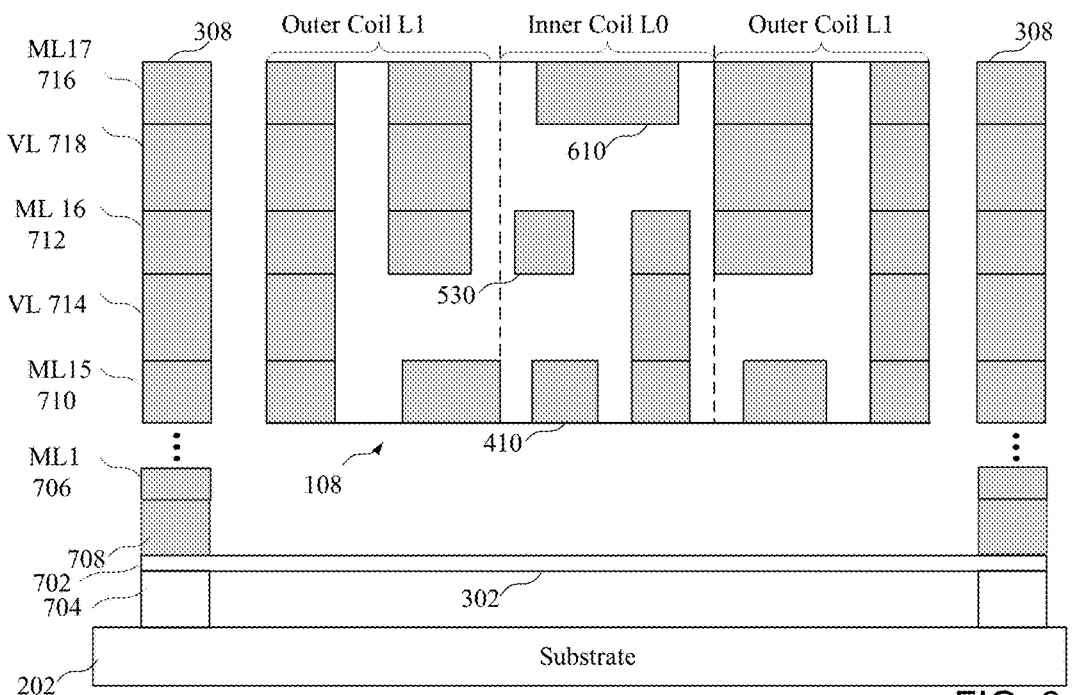
FIG. 8 is a second cross-sectional view showing the metal layers taken at lines 8-8.
Figure 9:
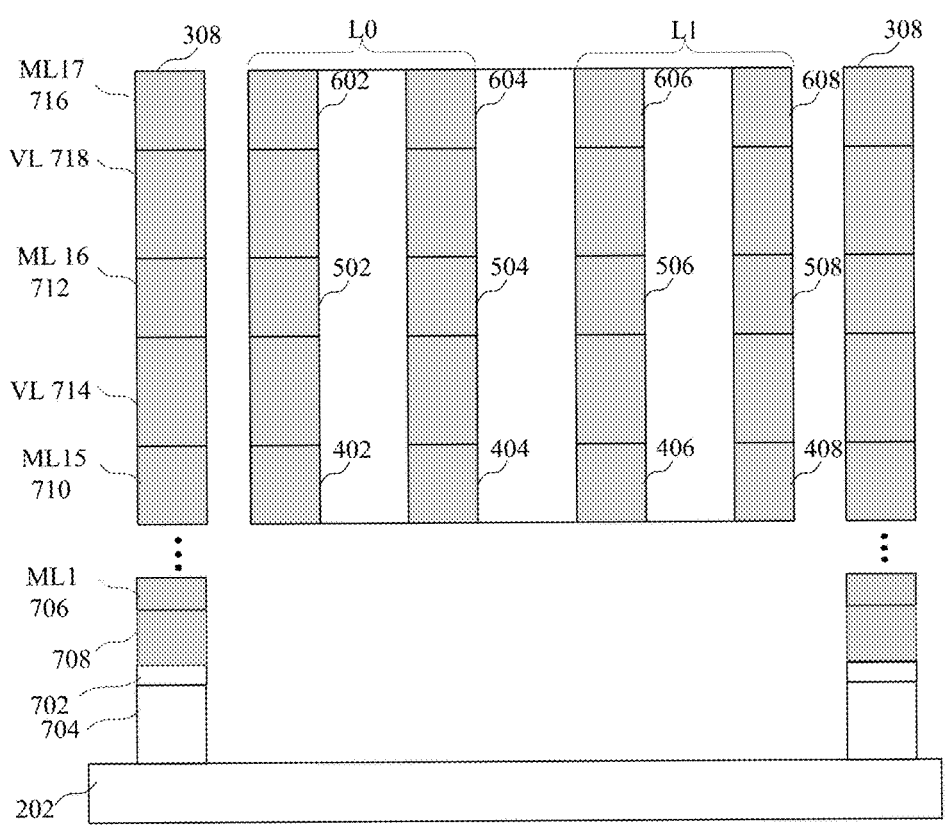
FIG. 9 is a third cross-sectional view showing the metal layers taken at lines 9-9.

Elements of the inner coil that extend through recesses are shown by way of example in FIG. 8 taken at lines 8-8. For example, a portion of the coil portion 410 are not connected to vias and extend below a portion of the coil portion 530. Similarly, a portion of the coil portion 530 extends below the center coil portion 610. The cross sections of FIGS. 7 and 8 are provided by way of example to show how recesses and crossover elements are created to allow a portion of a coil to extend through another coil without making electrical contact. As shown in FIG. 9, a third cross-sectional view showing the metal layers taken at lines 9-9 through the transformer legs including the side walls wall 308.

Figure 10:
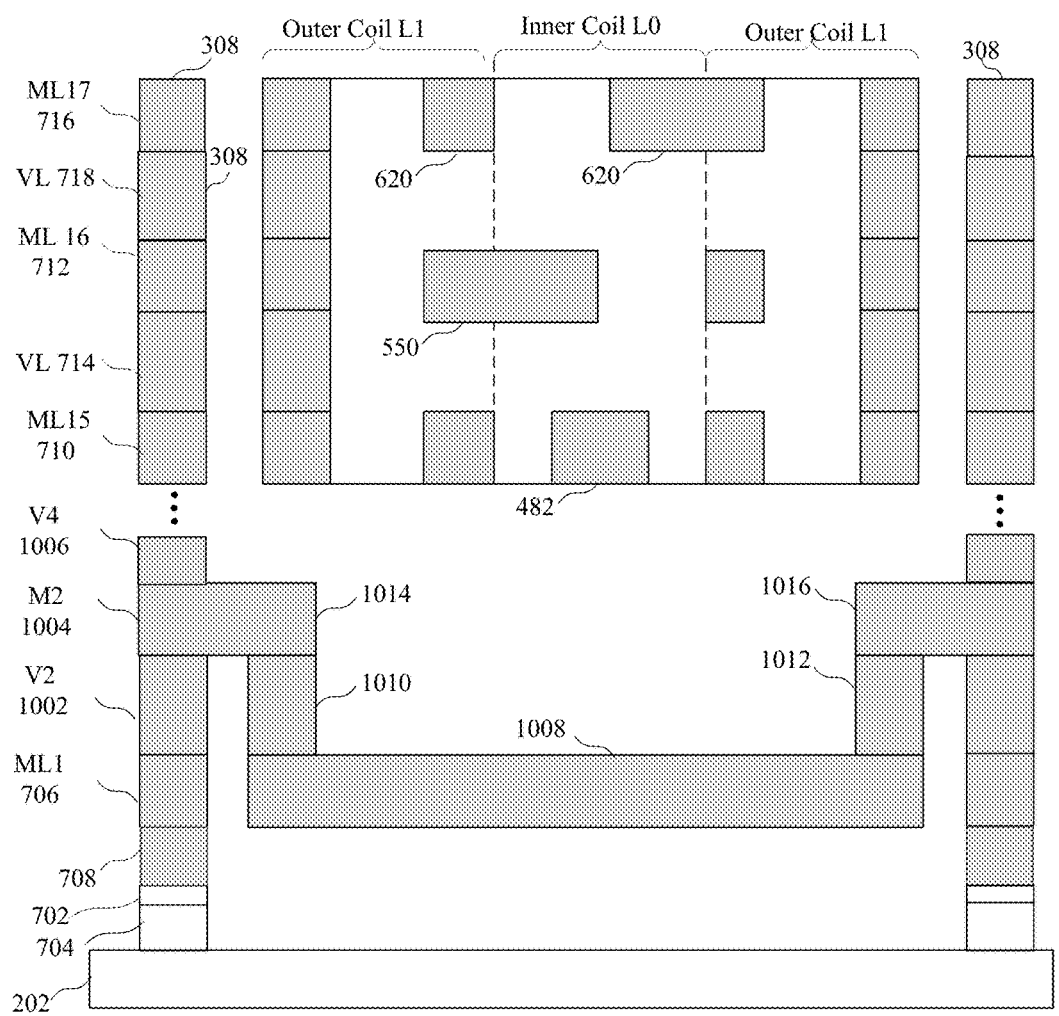
FIG. 10 is a cross-sectional view showing the implementation of a patterned ground shield in a metal interconnect routing layer.

Turning now to FIG. 10, a cross-sectional view shows the implementation of a pattern ground shield in a metal interconnect routing layer, rather than the M0 metal layer. As is shown in FIG. 10, rather than implementing the pattern ground shield in metal layer M0, the pattern ground shield is implemented in metal layer M1. When unidirectional metal traces are implemented in integrated circuit devices having traces with dimensions of 7 nm or below, it is not possible to make all necessary connections, such as a connection by a right angle trace to form a "T" or a "L" pattern. Because the metal layer M1 is a unidirectional metal layer above metal layer M0, the pattern ground shield is coupled to the wall 308 using another metal layer, such as metal layer M2 1004 as shown in FIG. 10. More particularly, the pattern ground shield 1008 is coupled by way of vias 1010 and 1012 to corresponding traces 1014 and 1016 of metal layer M2, each of which is coupled to the wall isolation 308. A via layer 1002 enables a coupling of the traces 1014 and 1016 and the wall 308 to the substrate 702 as shown.

Figure 11:
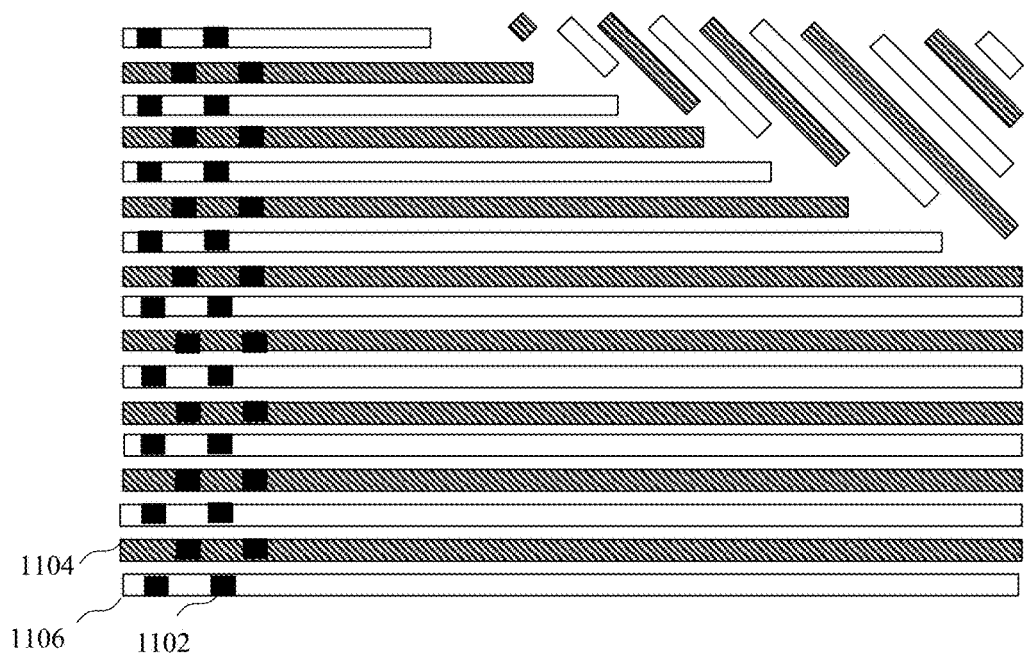
FIG. 11 is a top plan view showing connectivity vias on the M0 layer to enable the formation of the isolation wall 308.
Figure 12:
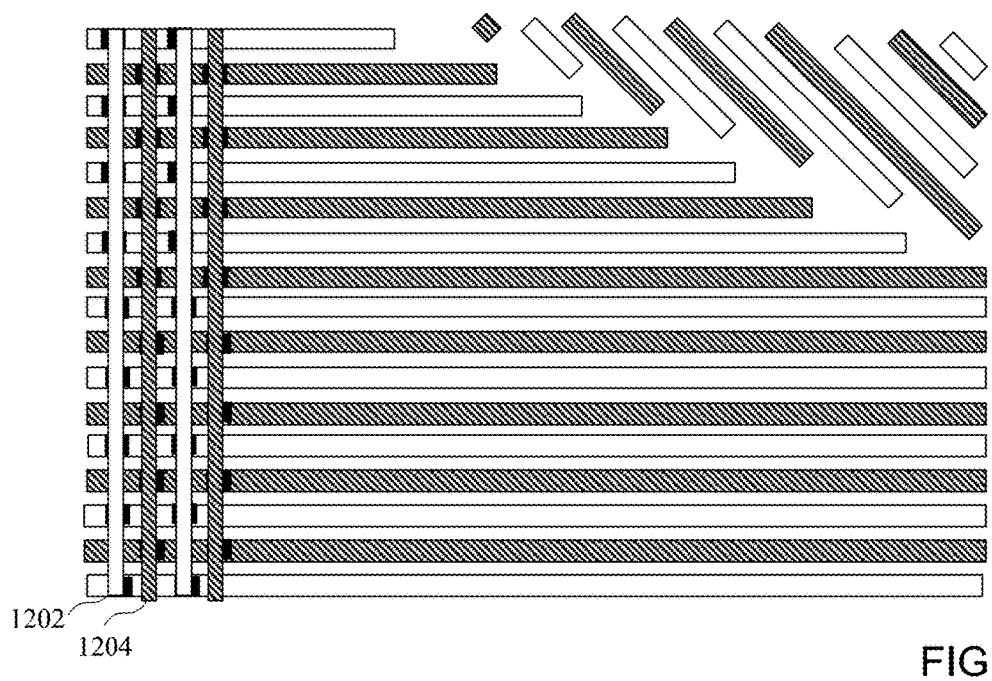
FIG. 12 is a top plan view showing traces of metal layer M1 of the isolation wall 308.
Figure 13:
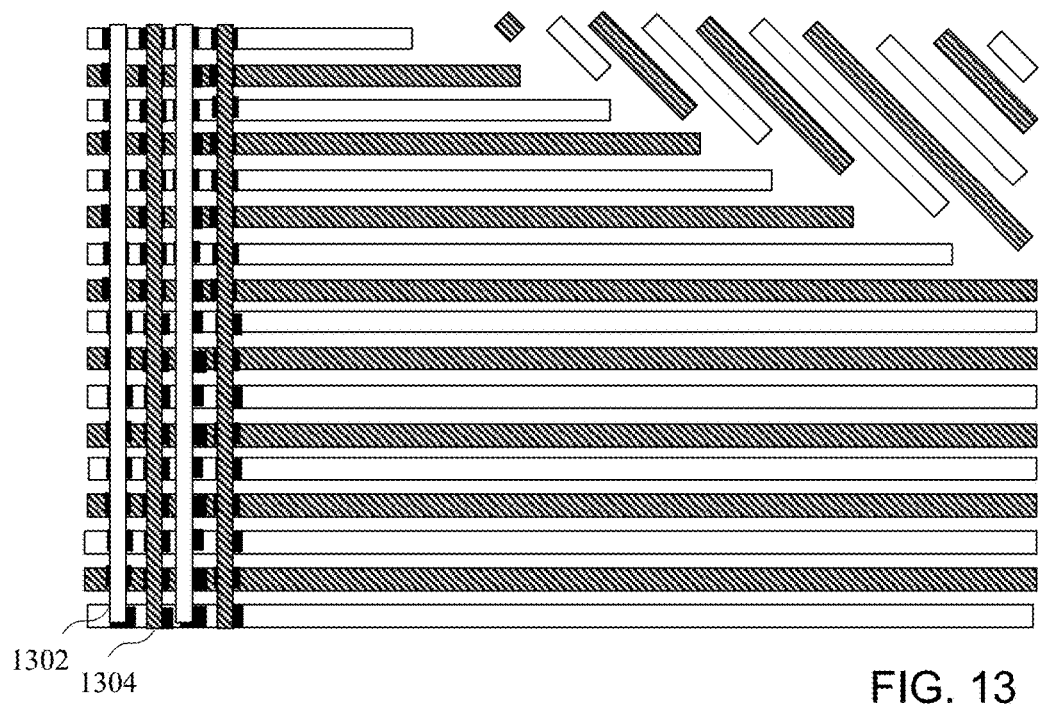
FIG. 13 is a top plan view showing traces of a top metal layer electrically connecting traces associated with both mask layers.

Turning now to FIGS. 11-13, top plan views show traces and vias associated with different metal layers to enable forming the isolation wall 308. As shown in FIG. 11, vias 1102 on the metal traces of the metal layer M0 formed by different mask layers 1104 and 1106 enable coupling the traces to a metal layer M1. Because of the narrow dimensions of the traces, two separate mask layers must be used to generate the alternating traces, show in white or hashed shading. As shown in FIG. 12, traces 1202 and 1204 enable coupling, for each mask layer, traces of the mask layer. A top metal layer, which would be metal layer M17 in the example above, enable coupling the metal layers of the two mask layers together using traces 1302 and 1304, as shown in FIG. 13.

Figure 14:
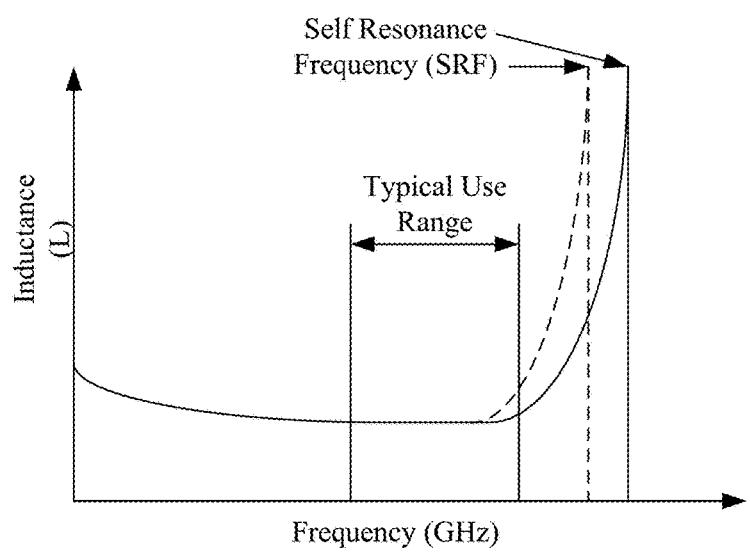
FIG. 14 is a diagram showing the improved operation of implementing a patterned ground shield in a bottom metal layer.

Turning now to FIG. 14, a diagram shows the improved operation of an including implementing a patterned ground shield in a bottom metal layer. By implementing the PGS in the metal layer M0 as shown by the solid line, the inductance provided by the inductor is more linear within the typical frequency range of use, and provides a wider frequency range of use. Because the inductor coil is implemented in higher metals, the distance from coil to M0 is the largest. Hence, the inductor has a lower parasitic capacitance, allowing a larger operating range. If M1 or higher is used for the PSG, then the parasitic would be higher and therefore reduce the SRF. A higher SRF is critical to support line rate increases, which means that circuits need to operate at higher frequencies, and could be limited by parasitic capacitance of an on-chip inductor. The SRF for an inductor arrangement having a PGS in the M0 layer would be 8-10% higher for a device having 7 nm transistors than an inductor having a PGS in the M1 layer. By way of example, if the SRF for the inductor were 36 Gigahertz (GHz) for an inductor arrangement of a conventional device, it would be approximately 39.6 GHz for an inductor arrangement having a PGS in the M0 layer.

Figure 15:
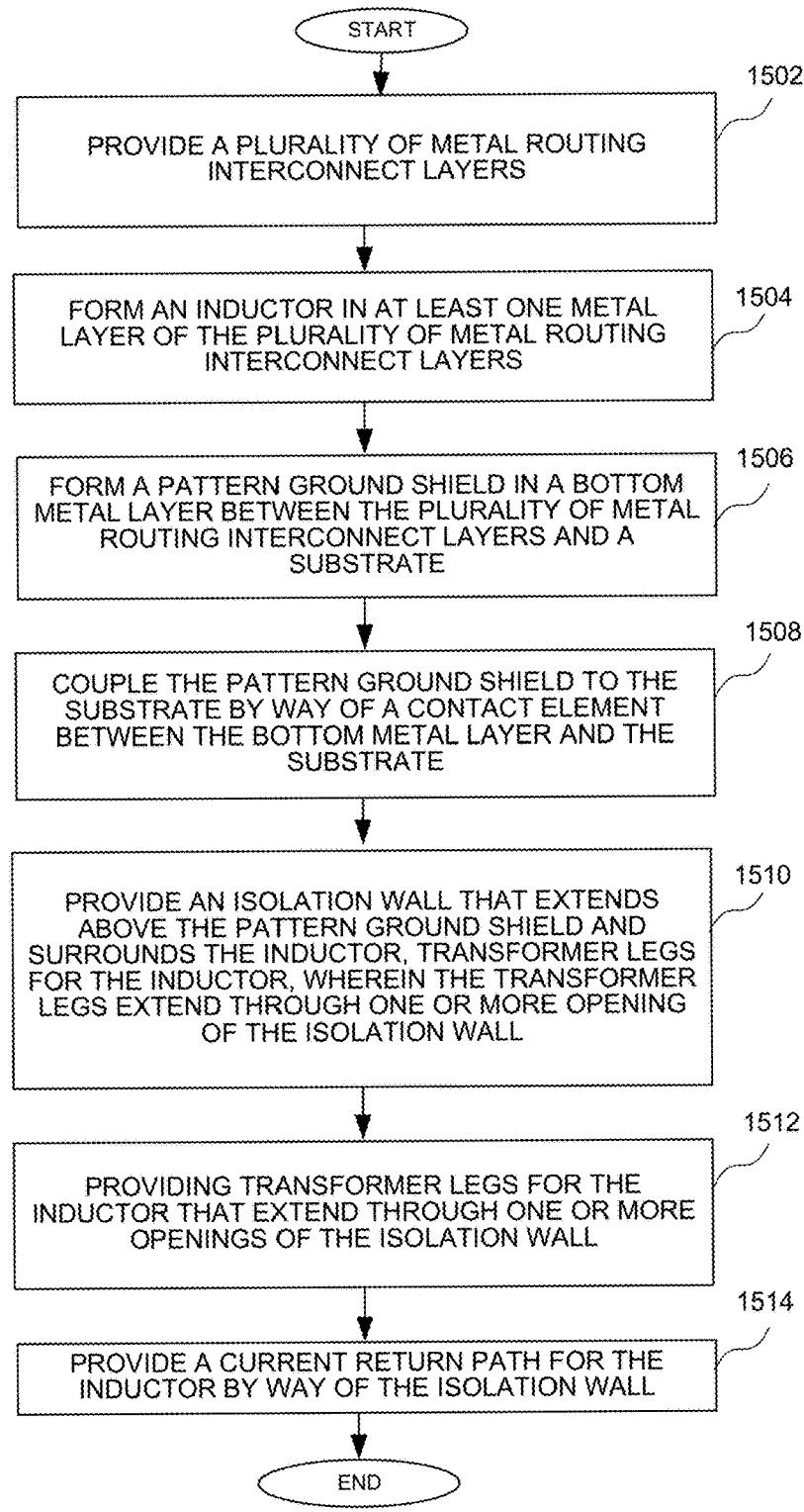
FIG. 15 is a flow chart showing a method of implementing an inductor in an integrated circuit.

Turning now to FIG. 15, a flow chart shows a method of implementing an inductor in an integrated circuit. In particular, a plurality of metal routing interconnect layers is provided at a block 1502. The metal routing layers could be any of the metal layers above the metal layer M0. An inductor in at least one metal layer of the plurality of metal routing interconnect layers is formed at a block 1504. The inductor could be implemented as described in reference to FIGS. 4-6, or some other suitable inductor. A pattern ground shield in a bottom metal layer between the plurality of metal routing interconnect layers and a substrate is formed at a block 1506. The ground pattern shield could be formed in the M0 metal layer for example. The pattern ground shield is coupled to the substrate by way of a contact element between the bottom metal layer and the substrate at a block 1508.

An isolation wall that extends above the pattern ground shield and that surrounds the inductor and extends along transformer legs for the inductor is provided at a block 1510. Transformer legs for the inductor that extend through one or more openings of the isolation wall are provided at a block 1512. A current return path for the inductor is provided by way of the isolation wall at a block 1514. The various elements of the method of FIG. 15 may be implemented using any elements of the circuits of FIGS. 1-14 as described, or using some other suitable circuits.

While specific elements of the method are described, it should be understood that additional elements of the method, or additional details related to the elements, could be implemented according to the disclosure of FIGS. 1-14. It can therefore be appreciated that new circuits for and methods of implementing a dual-mode oscillator in an integrated circuit implementing dual edge clocking has been described. It will be appreciated by those skilled in the art that numerous alternatives and equivalents will be seen to exist that incorporate the disclosed invention. As a result, the invention is not to be limited by the foregoing embodiments, but only by the following claims.

What is claimed is:

1. An integrated circuit device, comprising:
   a substrate;
   a plurality of metal routing interconnect layers;
   an inductor formed in at least one metal layer of the plurality of metal routing interconnect layers; and
   a bottom metal layer between the plurality of metal routing interconnect layers and the substrate;
   wherein a pattern ground shield is formed in the bottom metal layer, the pattern ground shield comprising bottom metal traces in the bottom metal layer, a metal routing interconnect layer of the plurality of metal routing interconnect layers being over and adjacent the bottom metal layer, the metal routing interconnect layer comprising a first metal trace and a second metal trace, the first metal trace and the second metal trace being connected to alternating ones of the bottom metal traces by respective vias.

2. The integrated circuit device of claim 1 wherein the pattern ground shield is coupled to the substrate by way of a contact element between the bottom metal layer and the substrate.

3. The integrated circuit device of claim 2 wherein the contact element comprises a diffusion contact element formed on the substrate.

4. The integrated circuit device of claim 1 further comprising an isolation wall extending above the pattern ground shield and surrounding the inductor, wherein the isolation wall includes the first metal trace and the second metal trace.

5. The integrated circuit device of claim 4 wherein the isolation wall comprises a current return path for the inductor.

6. The integrated circuit device of claim 1 wherein the pattern ground shield is formed in either an M0 layer or an M1 layer.

7. The integrated circuit device of claim 1 wherein the plurality of metal routing interconnect layers comprises unidirectional metal layers.

8. The integrated circuit device of claim 1 wherein the bottom metal layer comprises a unidirectional metal layer.

9. The integrated circuit device of claim 1 wherein the inductor is formed in a plurality of metal layers comprising bi-directional metal layers.

10. The integrated circuit device of claim 1 wherein transistors of the integrated circuit device have gate widths that are less than 10 nanometers and the bottom metal layer has metal traces having trace widths that are approximately 20 nanometers.

11. An integrated circuit device, comprising:
    a substrate;
    a plurality of metal routing interconnect layers;
    an inductor formed in at least one metal layer of the plurality of metal routing interconnect layers; and
    an isolation wall extending above a pattern ground shield and surrounding the inductor;
    wherein the pattern ground shield is formed in a bottom layer of the plurality of metal routing interconnect layers, and the bottom layer is a unidirectional metal layer and is connected to the isolation wall using a trace of a layer of the plurality of metal routing interconnect layers above the bottom layer.

12. The integrated circuit device of claim 11 wherein the pattern ground shield is coupled to the substrate by way of the trace of the layer of the plurality of metal routing interconnect layers.

13. The integrated circuit device of claim 12 wherein the isolation wall extends to the substrate.

14. The integrated circuit device of claim 13 wherein transistors of the integrated circuit device have gate widths that are less than 10 nanometers and the bottom layer has metal traces having trace widths that are approximately 20 nanometers.

15. The integrated circuit device of claim 11 wherein the inductor is formed in upper metal layers of the plurality of metal routing interconnect layers.

16. An integrated circuit device comprising:
    a substrate; and
    metal layers over the substrate; and
    wherein:
        an inductor is formed in an upper one or more of the metal layers;
        a pattern ground shield is formed in a lower one of the metal layers, the pattern ground shield being formed of sets of unidirectional metal traces of the lower one of the metal layers; and
        an isolation wall is formed in the metal layers and surrounding the inductor, the isolation wall comprising, for each of the sets of unidirectional traces, a first metal trace and a second metal trace in a mid-layer of the metal layers over the lower one of the metal layers, wherein for each of the sets of unidirectional traces, the first metal trace and the second metal trace are connected by vias to alternating ones of the unidirectional traces of the respective set of unidirectional traces.

17. The integrated circuit device of claim 16, wherein the lower one of the metal layers is an M0 layer.

18. The integrated circuit device of claim 16 further comprising a contact element connecting the pattern ground shield to the substrate.

19. The integrated circuit device of claim 16, wherein the upper one or more of the metal layers are bi-directional metal layers.

20. The integrated circuit device of claim 16, wherein the isolation wall comprises a current return path for the inductor.

* * * * *